(12) United States Patent
Hirota

(10) Patent No.: US 9,752,229 B2
(45) Date of Patent: Sep. 5, 2017

(54) FILM DEPOSITION DEVICE

(71) Applicant: KOBE STEEL, LTD., Kobe-shi (JP)

(72) Inventor: Satoshi Hirota, Takasago (JP)

(73) Assignee: Kobe Steel, Ltd., Kobe-shi (JP)

( * ) Notice: Subject to any disclaimer, the term of this patent is extended or adjusted under 35 U.S.C. 154(b) by 0 days.

(21) Appl. No.: 14/905,123

(22) PCT Filed: Jun. 25, 2014

(86) PCT No.: PCT/JP2014/066817
§ 371 (c)(1),
(2) Date: Jan. 14, 2016

(87) PCT Pub. No.: WO2015/019730
PCT Pub. Date: Feb. 12, 2015

(65) Prior Publication Data
US 2016/0160343 A1    Jun. 9, 2016

(30) Foreign Application Priority Data
Aug. 6, 2013 (JP) ................................. 2013-163477

(51) Int. Cl.
  *C23C 14/35* (2006.01)
  *H01J 37/34* (2006.01)
(52) U.S. Cl.
  CPC ............ *C23C 14/35* (2013.01); *C23C 14/352* (2013.01); *H01J 37/345* (2013.01); *H01J 37/3405* (2013.01); *H01J 37/3447* (2013.01)
(58) Field of Classification Search
  None
  See application file for complete search history.

(56) References Cited

U.S. PATENT DOCUMENTS

| 4,756,810 A | * | 7/1988 | Lamont, Jr. ........... C23C 14/225 |
| | | | 204/192.15 |
| 5,510,011 A | * | 4/1996 | Okamura ................ C23C 14/34 |
| | | | 117/105 |

(Continued)

FOREIGN PATENT DOCUMENTS

| EP | 2 548 992 A1 | 1/2013 |
| JP | 6-179967 A | 6/1994 |

(Continued)

OTHER PUBLICATIONS

International Search Report Issued Sep. 22, 2014 in PCT/JP14/66817 Filed Jun. 25, 2014.

(Continued)

*Primary Examiner* — Dah-Wei D Yuan
*Assistant Examiner* — Jethro M Pence
(74) *Attorney, Agent, or Firm* — Oblon, McClelland, Maier & Neustadt, L.L.P.

(57) ABSTRACT

A film deposition device including a DMS target and a film-deposition power source, being capable of pre-sputtering the target by use of the film-deposition power source. The film deposition device includes: a film deposition chamber; first and second cathodes each having a target and disposed next to each other wherein surfaces of the target face a substrate; a magnetic-field formation unit forming a magnetic field in vicinity of the target surfaces; a film-deposition power source connected to both of the cathodes; and a shutter. The shutter makes an opening-closing action between a close portion at which the shutter is interposed between the substrate and the target surfaces of both cathodes to block the target surfaces collectively from the substrate and an open position to allow film deposition on the substrate through opening the space between the target surfaces and the substrate.

16 Claims, 5 Drawing Sheets

(56) References Cited

U.S. PATENT DOCUMENTS

| | | |
|---|---|---|
| 2010/0140083 A1 | 6/2010 | Tietema et al. |
| 2013/0020195 A1 | 1/2013 | Yamamoto et al. |
| 2013/0153413 A1 | 6/2013 | Yang et al. |
| 2014/0363648 A1 | 12/2014 | Yamamoto et al. |

FOREIGN PATENT DOCUMENTS

| | | | | | |
|---|---|---|---|---|---|
| JP | H06-179967 A | * | 6/1994 | ......... | C23C 14/3407 |
| JP | 2000-038663 A | * | 2/2000 | ......... | C23C 14/3407 |
| JP | 2000-38663 A | | 2/2000 | | |
| JP | 2001-115259 A | | 4/2001 | | |
| JP | 2001-234338 A | | 8/2001 | | |
| JP | 2008-127610 A | | 6/2008 | | |
| JP | 2008-240110 A | | 10/2008 | | |
| JP | 2010-507728 A | | 3/2010 | | |
| JP | 2011-256442 A | | 12/2011 | | |
| JP | 2013-23744 A | | 2/2013 | | |
| JP | 2013-124405 A | | 6/2013 | | |

OTHER PUBLICATIONS

English translation of the International Preliminary Report on Patentability and Written Opinion issued on Feb. 9, 2016 in PCT/JP2014/066817.
Extended European Search Report issued Feb. 8, 2017 in Patent Application No. 14835049.9.

* cited by examiner

FILM DEPOSITION DEVICE

TECHNICAL FIELD

The present invention relates to a device capable of film deposition by dual magnetron sputtering.

BACKGROUND ART

Magnetron sputtering is conventionally known as a means for film deposition on the surface of a substrate. In magnetron sputtering, there are used a target formed of a plate-like film-deposition material, a magnetic-field formation unit disposed behind the target, and a power source for applying sputtering voltage to the target. The power source generates glow discharge through application of the voltage, thereby ionizing an inert gas. Meanwhile, the magnetic-field formation unit forms a magnetic field in front of the target, thus allowing the ions to be irradiated directionally along the magnetic field. The magnetic field captures secondary electrons knocked off the target and promotes efficiently gas ionization, thereby allowing glow discharge to be maintained even at a low inert gas pressure to increase film deposition rate. This magnetron sputtering is utilized to restrain the secondary electrons and/or plasma from damaging the surface of the substrate, by means of the virtue of the magnetic field design thereof or utilized to control film characteristics through the plasma effect.

Furthermore, in recent years, in order to solve problems pertaining to contamination of the surface of the above targets, there have witnessed developments of dual magnetron sputtering (DMS) with use of a pair of targets as a cathode and anode of glow discharge, respectively. In DMS, disposition of, for instance, an AC power source between the pair of targets and alternate application of voltage between the targets is performed to thereby removing insulator generated on the surfaces of the targets, namely, self-cleaning; this allows film quality to be stabilized.

For instance, PTL 1 discloses a device that is schematically illustrated in FIG. 5. The device is provided with: a film deposition chamber 90 that accommodates a substrate 96; a first cathode 91 and a second cathode 92 that are disposed at opposite positions in the film deposition chamber 90; a film-deposition AC power source 94 connected to the cathodes 91, 92 to apply voltage alternately to the cathodes 91, 92; and not-graphically-shown magnetic-field formation magnets disposed behind respective cathodes 91, 92. The film deposition chamber 90 illustrated in the figure has a substantially octagonal cross-sectional shape, when viewed from above, in the center of which the substrate 96 is disposed. Each of the cathodes 91, 92 has a target formed of a film-deposition material and a cathode body retaining the target, disposed at mutually opposite positions in the vicinity of the side walls of the film deposition chamber 90 in such an attitude that the targets face the substrate 96. The substrate 96 is, therefore, disposed between the cathodes 91, 92.

The device disclosed in PTL 1, however, involves a problem of no ability of utilizing existing equipment for performing so-called pre-sputtering in advance of the start of film deposition.

The purposes of the pre-sputtering include: removal of impurities on the target surface (namely, self-cleaning); gradually increasing the target temperature to an appropriate temperature; and stabilization of the discharge state. The pre-sputtering can be achieved by eliciting discharge in each target in a state where the space between the substrate before film deposition and the targets is blocked by respective shutters. The shutters are opened upon the complement of the pre-sputtering, and film deposition on the substrate is initiated from that point onwards. In other words, the shutters are closed during pre-sputtering, thereby preventing unintended film deposition from being performed on the substrate by pre-sputtering.

The pre-sputtering, thus, requires an openable-closable shutter between the substrate and each target; however, if shutters, for instance, shutters 98 denoted by the two-dot chain lines in FIG. 5, were disposed between the cathodes 91, 92 and the substrate 96, the shutters would also block the targets of the cathodes 91, 92 from each other; this prevents the discharge between the cathodes 91, 92 from being carried out with use of the AC power source 94 for film deposition. Thus, there is inconvenience that the pre-sputtering of the targets cannot be carried out by use of the existing AC power source 94 for film deposition. Hence, this conventional device requires a dedicated power source for pre-sputtering, separate from the AC power source 94 for film deposition, to be prepared individually for the cathodes 91, 92. This involves significant increase in equipment costs.

CITATION LIST

Patent Literature

PTL 1: Japanese Unexamined Patent Application Publication (Translation of PCT Application) No. 2010-507728

SUMMARY OF INVENTION

It is an object of the present invention to provide a film deposition device including at least one pair of targets for dual magnetron sputtering and a film-deposition power source, the film deposition device being capable of pre-sputtering of the target by use of the above film-deposition power source.

The film deposition device provided by the present invention includes: a film deposition chamber that accommodates a substrate at a specific position; a first cathode and a second cathode each having a target, the first cathode and the second cathode being disposed next to each other in such an attitude that respective surfaces of the targets face the substrate disposed at the specific position; a magnetic-field formation unit that forms a magnetic field for magnetron sputtering in the vicinity of the surfaces of the respective targets of the first and second cathodes; a film-deposition power source that is connected to the first and second cathodes to apply voltage to the first and second cathodes; and a shutter capable of making an opening-closing action between a close portion at which the shutter is interposed between the substrate and the surfaces of the respective targets of the first and second cathodes to block the surfaces of the respective targets of the first cathode and the second cathode, collectively, from the substrate and an open position at which the shutter opens the space between the substrate and the surfaces of the respective targets of the first and second cathodes to allow film deposition on a surface of the substrate to be performed by the targets.

DESCRIPTION OF EMBODIMENTS

Preferred embodiments of the present invention will be explained with reference to FIG. 1 to FIG. 4.

Figure 1:
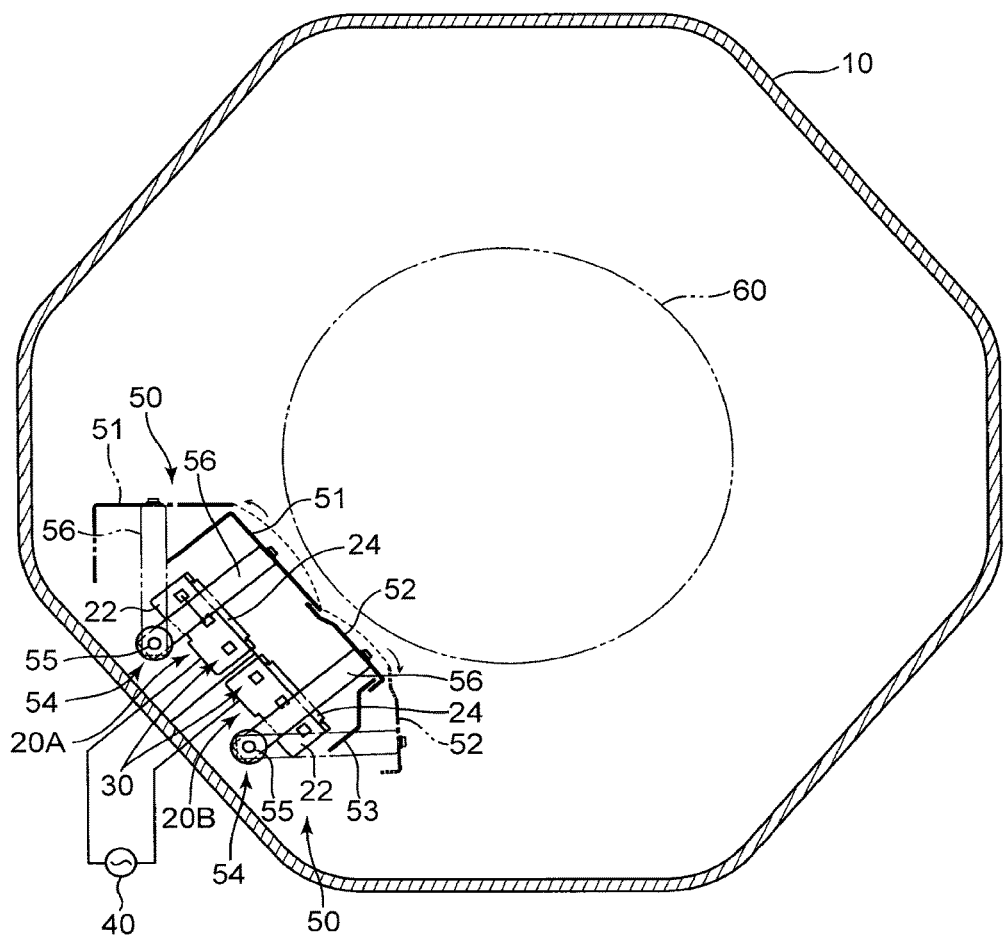
FIG. 1 is a cross-sectional plan-view diagram of a film deposition device according to a first embodiment of the present invention.
Figure 2:
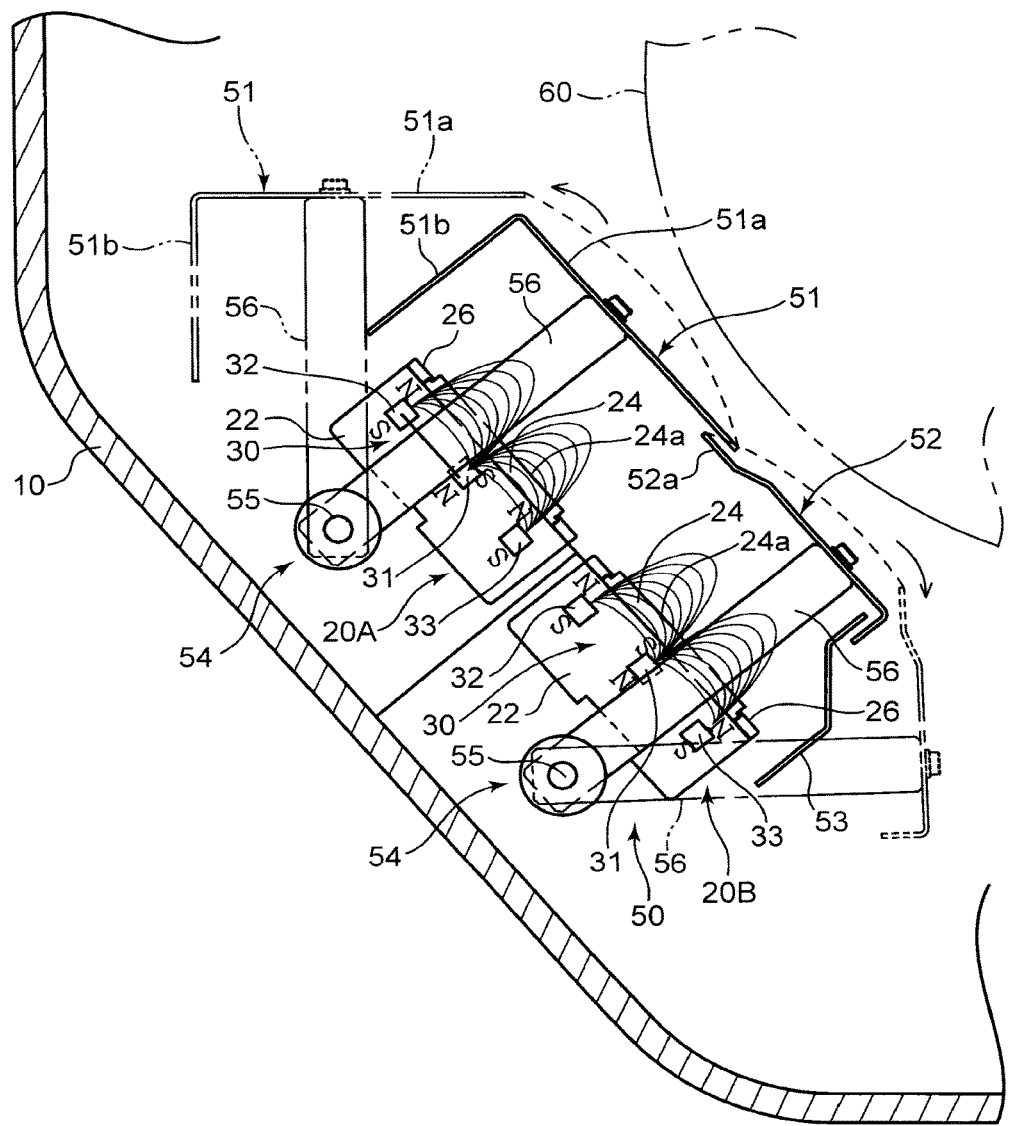
FIG. 2 is a plan-view diagram illustrating a relevant portion of the film deposition device.
Figure 3:
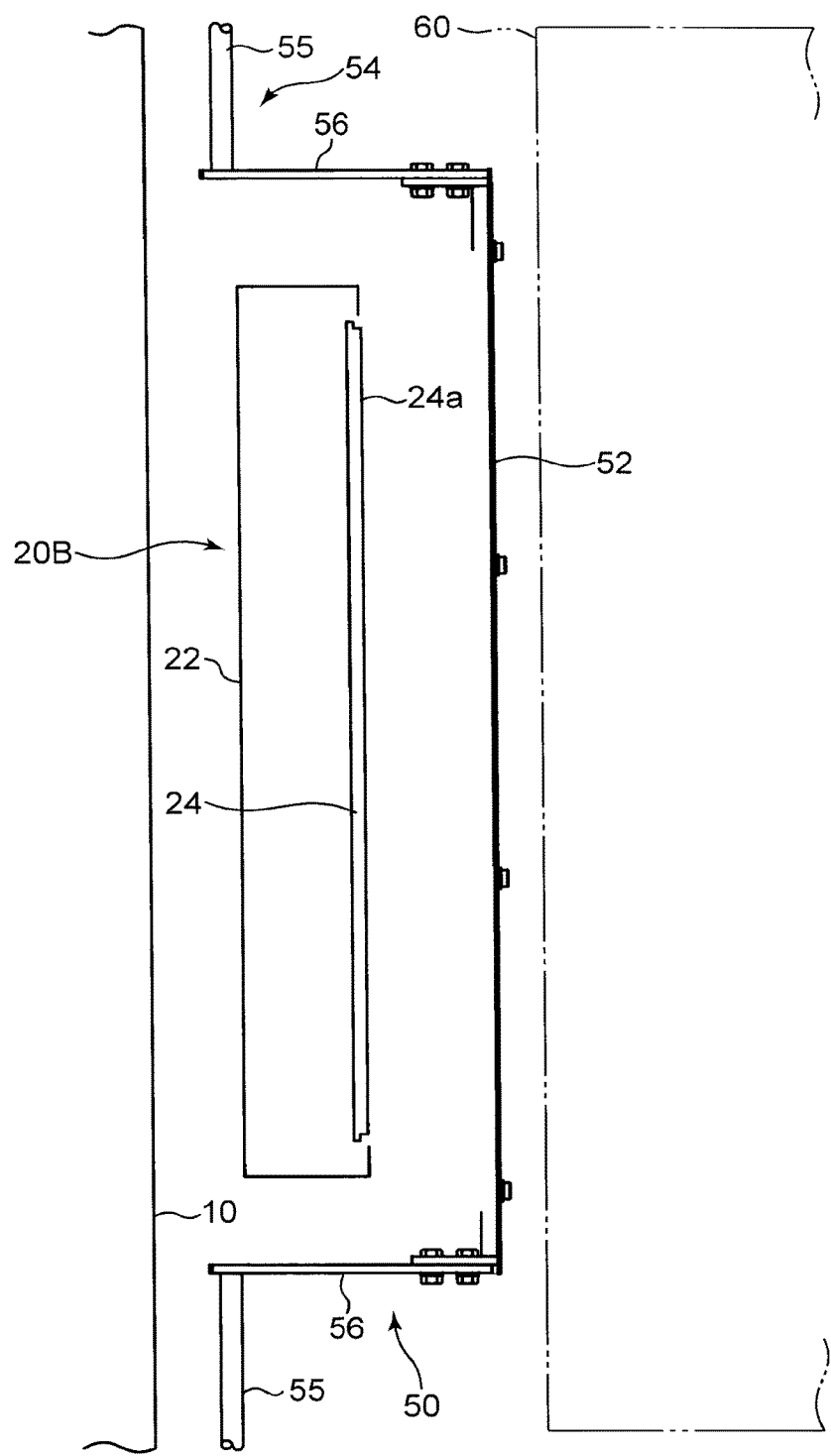
FIG. 3 is a cross-sectional side-view diagram illustrating a relevant portion of the film deposition device.

FIG. 1 to FIG. 3 illustrate a film deposition device according to a first embodiment of the present invention. The film deposition device includes: a film deposition chamber 10; first and second cathodes 20A, 20B for DMS; magnetic-field formation units 30 provided for the cathodes 20A, 20B, respectively; a film-deposition power source 40 (for DMS); and a shutter mechanism 50.

The film deposition chamber 10 accommodates a substrate on which a film deposition is to be performed and defines a space in which an inert gas for sputtering (reaction gas in a case where a compound thin film is to be formed) is to be enclosed. In the present invention, the specific shape of the film deposition chamber 10 is not limited; the film deposition chamber 10 shown in FIG. 1 has a substantially octagonal cross-sectional shape, in a plan view, in the center of which a substrate accommodation space 60 is defined.

The substrate accommodation space 60 defined in the present embodiment is a cylindrical one extending along the rotational axis of the film deposition chamber 10. Directly below the space is disposed a not-shown disc-shaped substrate support table. The substrate accommodation space 60 may accommodate a large single cylindrical substrate having a shape substantially identical to that of the substrate accommodation space 60 or a plurality of small-diameter cylindrical substrates placed on the substrate support table and aligned horizontally. The substrate support table may be of fixed type or rotatable type.

Each of the first and second cathodes 20A, 20B has a cathode body 22 and a target 24 removably retained on the cathode body 22.

The cathode bodies 22 are formed of a conductive material and into a block-shape, in the present embodiment, into a prismatic shape extending vertically. Each cathode body 22 has a target retaining section 26 that retains removably the target 24. The target retaining section 26 is provided on a specific side face of the cathode body 22.

Each target 24 is formed of a film-deposition material such as aluminum, and has a thin plate shape that extends along a side face of the cathode body 22 on which the target retaining section 26 is provided. The target 24 can be electrically connected together with the cathode body 22 while retained by the target retaining section 26.

As the feature of the film deposition device, the first cathode 20A and the second cathode 20B are disposed next to each other in such an attitude that respective surfaces 24a of all the targets 24 face the substrate accommodated in the substrate accommodation space 60 (i.e., disposed at a specific position). In the present embodiment, the first and second cathodes 20A, 20B are disposed so as to orient the target surfaces 24a in the same direction, specifically, so as to make the normal direction of each of the target surfaces 24a be substantially parallel to a chamber radial direction of joining the center axis of the substrate accommodation space 60 and a middle position between the two cathodes 20A, 20B to each other. The present invention encompasses instances where the normal directions of the target surfaces 24a are significantly oblique to each other, but such disposition of the targets 24 that the respective normal directions are substantially parallel to each other contributes to reduced space necessary for the two cathodes 20A, 20B and reduced size of the below-described shutter mechanism 50.

The magnetic-field formation units 30 are provided for the first and second cathodes 20A, 20B, respectively, and form respective magnetic fields for magnetron sputtering in the vicinity of the surfaces 24a of the targets 24 of the cathodes. Specifically, each of the magnetic-field formation units 30 according to the present embodiment has three permanent magnets, namely, a first permanent magnet 31, a second permanent magnet 32 and a third permanent magnet 33, which are built into the respective cathode bodies 22 so as to be located behind the target 24.

The magnetic field for magnetron sputtering is formed so as to capture, by Lorentz forces, secondary electrons that has been knocked off the surfaces 24a of the targets 24. FIG. 2 shows magnetic field lines of the magnetic fields. The permanent magnets 31 to 33 are arrayed so as to form the above magnetic fields. Specifically, the first permanent magnet 31 is disposed at a central position with respect to the cathode width direction of the cathodes 20A, 20B (in the present embodiment, a direction parallel to the direction in which the cathodes 20A, 20B are juxtaposed) and built into the cathode body 22 so as to direct the N-pole of the magnet to the target 24. The second and third permanent magnets 32, 33 are disposed at respective positions on both outer sides of the first permanent magnet 31, in the cathode width direction, and are built into the cathode body 22 so as to direct the S-poles of the second and third permanent magnets 32, 33 to the target 24.

The film-deposition power source 40 is connected to the first cathode 20A and the second cathode 20B and applies voltage alternately to the cathodes 20A, 20B, at specific periods, thereby generating gas ion atoms (ion atoms of inert gas enclosed inside the film deposition chamber 10) for knocking off the material of the target 24 and contaminants that are adhered to the material of the target 24. As the film-deposition power source 40 can be used not only the AC power source illustrated in the figure but also a bipolar pulse power source that alternately reverses the positive-negative polarity of output voltage.

The shutter mechanism 50 includes: movable shutter plates 51, 52 being a pair of opening-closing members movable in an opening-closing direction; an auxiliary shutter plate 53; and a pair of opening-closing support mechanisms 54 that support the movable shutter plates 51, 52 movably in the opening-closing direction. The shutter plates 51 to 53 constitute the shutter according to the present invention.

The movable shutter plates 51, 52 are juxtaposed in a direction parallel to the juxtaposition direction of the targets 24 of the two cathodes 20A, 20B and supported by the film deposition chamber 10 through the opening-closing support mechanisms 54 so as to be movable between a close portion denoted by solid lines in FIG. 1 to FIG. 3 and an open position denoted by two-dot chain lines in FIG. 1 and FIG. 2. At the close portion, the movable shutter plates 51, 52 are interposed between the surface of the substrate and the surfaces 24a, respectively, to collectively block the surfaces 24a of the respective targets 24 of the first and second cathodes 20A, 20B from the surface of the substrate disposed in the substrate accommodation space 60. At the open position, the movable shutter plates 51, 52 open the space between the surfaces 24*a* of the targets 24 of the first and second cathodes 20A, 20B and the surface of the substrate to allow film deposition on the surface of the substrate to be performed by the targets 24.

The movable shutter plate 51 integrally has a main wall portion 51*a* and a side wall portion 51*b*, each having a flat plate-like shape. The main wall portion 51*a*, in the close portion, takes an attitude parallel to the target surfaces 24*a* at a distance from the target surfaces 24*a* on the substrate side so as to block the surface 24*a* of the target 24 of the first cathode 20A and the surface of the substrate from each other. The side wall portion 51*b* extends rearward (direction toward the first cathode 20A) from the outer edge of the main wall portion 51*a* so as to cover the space behind the main wall portion 51*a* at the close portion (that is, cover the space in front of the target surfaces 24*a*) at the side of the space.

The entire movable shutter plate 52 has a substantially flat plate-like shape and takes, in the close position, an attitude parallel to the target surfaces 24*a* at a distance therefrom on the substrate side so as to block the surface 24*a* of the target 24 of the second cathode 20B from the surface of the substrate. The movable shutter plate 52 has an inner edge portion 52*a* in a shape retracting inward by one step beyond other portions to be capable of overlapping the inner edge portion of the movable shutter plate 51 in a front-rear direction (direction parallel to the radial direction of the film deposition chamber 10), in the close portion. The overlap of respective inner edge portions allows the block of the surfaces 24*a* of the targets 24 from the surface of the substrate to be more reliable. This makes it possible to prevent particles from leakage from the targets 24 to the surface of the substrate through the clearance between the inner edge portions.

The auxiliary shutter plate 53 is disposed so as to cover a space behind the movable shutter plate 52 at the close portion (the space in front of the target surface 24*a*), at the side of the space. Specifically, the auxiliary shutter plate 53 is fixed to the film deposition chamber 10 at such a position and in such an attitude that the auxiliary shutter plate 53 extends rearward (in a direction of approaching the second cathode 20B) from the outer edge of the movable shutter plate 52 at the close portion. The auxiliary shutter plate 53 can be also formed integrally with the movable shutter plate 52.

The specific shape of the shutters according to the invention is not limited. For instance, the side wall portion 51*b* of the movable shutter plate 51 and the auxiliary shutter plate 53 may have reduced dimensions or may be omitted, depending on the specifications. The members that make up the shutter do not have to be shaped into flat plate, but may have a curved-plate shape.

The opening-closing support mechanisms 54, disposed in the film deposition chamber 10, support the movable shutter plates 51, 52 so as to allow the movable shutter plates 51, 52 to move between the close portion and the open position. In the present embodiment, the open positions of the movable shutter plates 51, 52 are set to respective positions on both outer sides of the close portion, with respect to the juxtaposition direction of the movable shutter plates 51, 52, and the opening-closing support mechanisms 54 support the movable shutter plates 51, 52 so as to allow movable shutter plates 51, 52 to make rotational movement about respective vertical rotational axes set at the rear of the first and second cathodes 20A, 20B (i.e. direction perpendicular to the arrangement direction of both targets 24), thereby enabling each of the movable shutter plates 51, 52 to make an opening-closing movement.

Specifically, each of the opening-closing support mechanisms 54 includes a pair of upper and lower pivot shafts 55 and a pair of upper and lower rotative arms 56. The pivot shafts 55 are disposed in an attitude of extending vertically into coincidence with the rotational axes of the movable shutter plates 51, 52, and held by the top wall and the bottom wall of the film deposition chamber 10 so as to be rotatable about their respective axes. The rotating arms 56 are disposed so as to bridge respective cathodes (that is, the first cathode 20A for the opening-closing support mechanism 54 supporting the movable shutter plate 51 and the second cathode 20B for the opening-closing support mechanism 54 that supports the movable shutter plate 52) at upper and lower side of each of the cathodes, to link respective inner ends of the pivot shafts 55 and the upper and lower ends of the movable shutter plates 51, 52. In short, the opposite ends of the upper rotating arms 56 are connected to the lower end of the upper pivot shaft 55 and the upper end of the movable shutter plate 51 or 52, respectively, while the opposite ends of the lower rotating arms 56 are connected to the upper end of the lower pivot shaft 55 and the lower end of the movable shutter plate 51 or 52, respectively.

The purpose of setting respective rotational axes of the movable shutter plates 51, 52 at respective positions behind the first and second cathodes 20A, 20B (i.e., on the side opposite to the movable shutter plates 51, 52 across the cathodes 20A, 20B) is to make the rotation radius of the movable shutter plates 51, 52 be large enough to prevent the rotational trajectory of the movable shutter plates 51, 52 from bulging toward the substrate accommodation space 60. Thus setting the rotational axes allows the movable shutter plates 51, 52 to be close to the substrate accommodation space 60 while preventing the movable shutter plates 51, 52 from entering the substrate accommodation space 60 to thereby allow the entire device to have a reduced size.

To one of the pivot shafts 55 of the opening-closing support mechanisms 54 is connected a not-graphically-shown actuator which is a driving source to actuate the movable shutter plates 51, 52 in the opening-closing direction through the opening-closing support mechanisms 54. The driving source is not essential to the present invention. Besides, the opening-closing support mechanisms 54 may be connected to each other via an appropriate linking mechanism so as to make synchronized movement with each other in the opening-closing direction, which makes it possible to bring both of the movable shutter plates 51, 52 into opening-closing movement by use of a single driving source.

In the present invention, also the specific movement of the shutters for opening and closing is not limited. For instance, each of the movable shutter plates 51, 52 may make translational movement between the close portion at which each of the movable shutter plates 51, 52 is interposed between the surfaces 24*a* of the targets 24 and the substrate surface and the open position apart from the close portion upward or downward or outward in both directions. It is also possible to block respective surfaces 24*a* of both targets 24 from the surface of the substrate by use of a single movable shutter plate.

Although not shown in the figures, the device may further include, a bias power source for controlling film quality through drawing inert gas ions into collision against a workpiece, exhaust equipment for evacuating the interior of the film deposition chamber 10, and a gas introduction unit for introducing gas into the film deposition chamber 10.

With the above-described film deposition device, there can be formed a thin film of high quality on the surface of a substrate, for instance, by following the steps described below.

1) Preparation Step

A substrate is set in the substrate accommodation space 60 inside the film deposition chamber 10, and necessary targets 24 are attached to the cathode bodies 22 of the first and second cathodes 20A, 20B. Thereafter, the interior of the film deposition chamber 10 is sealed up and evacuated, and then an inert gas for sputtering (for instance, argon gas) and, if necessary, a reaction gas are sealed in. For example, in the case of depositing an alumina film on the surface of the substrate, an aluminum target is attached to each cathode body 22 as the target 24, and oxygen gas is enclosed as the reaction gas.

2) Pre-Sputtering

In advance of film deposition on the substrate, there is performed so-called pre-sputtering. The film deposition (DMS) on the substrate is carried out through alternate application of voltage to the first and second cathodes 20A, 20B from the film-deposition power source 40 to cause discharge from the first and second cathodes 20A, 20B, but it is difficult to obtain a desired film quality and film deposition rate if the film deposition is initiated simultaneously with the discharge, since the temperature of the targets 24 is low immediately after discharge starts and the discharge voltage is slightly high, which is likely to cause a reaction mode (for instance, for metal mode, reactive mode, and transition mode therebetween) to deviate from a desired mod. For the reason, there is performed pre-sputtering until the discharge state reaches stability.

In pre-sputtering, the discharge from the targets 24 takes place while the movable shutter plates 51, 52 which are opening-closing members are kept in the close portion, i.e., in a state where the movable shutter plates 51, 52 block the surfaces 24a of the respective targets 24 of the cathodes 20A, 20B from the substrate surface, respectively. Although the time elapsed until the reaches stability ranges generally from several tens of seconds to several minutes after discharge start, the stabilization of the discharge can be waited out, without deposition of an undesirable film on the surface of the substrate, despite the above discharge, since the movable shutter plates 51, 52 block the target surfaces 24a from the substrate surface, respectively. In addition, in the case of contaminant adhesion to the surfaces of the targets 24, the contaminant can be knocked off by sputtering (so-called self-cleaning), which is also effective in terms of improving the quality of the film formed in the subsequent steps.

Figure 5:
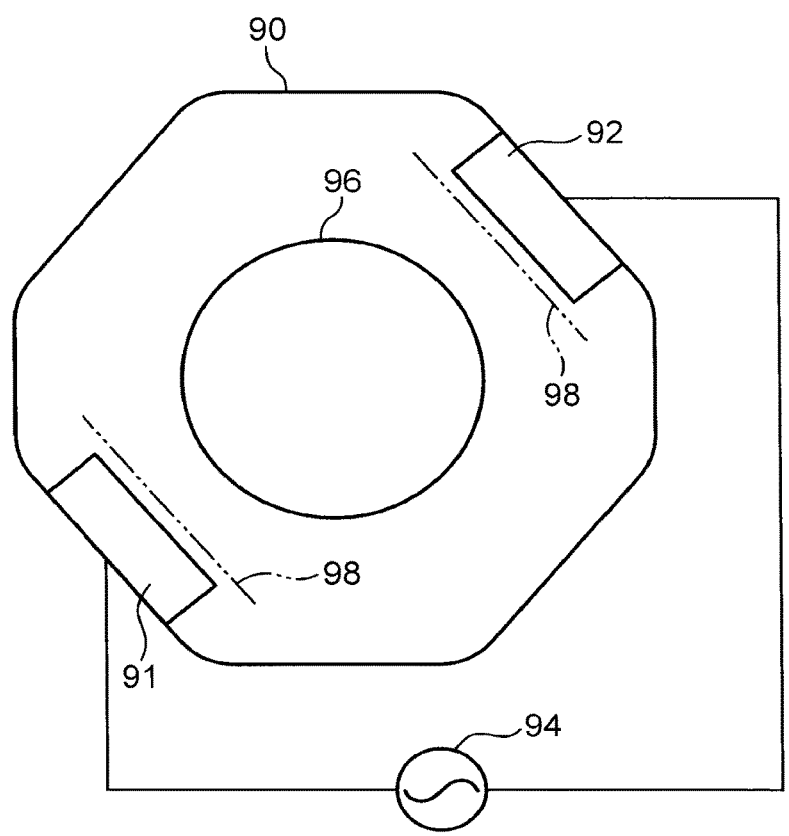
FIG. 5 is a cross-sectional plan-view diagram illustrating a conventional film deposition device.

Furthermore, the disposition of the targets 24 of the first and second cathodes 20A, 20B next to each other, as illustrated in FIG. 1 and FIG. 2, enables the pre-sputtering to be carried out by use of the film-deposition power source 40. For example, in the case of disposing the cathodes 91, 92, so as to oppose them to each other across the substrate 96 like the device shown in FIG. 5, if the shutters 98 such as those denoted by the two-dot chain lines in the figure were interposed between the cathodes 91, 92 and the substrate 96, the shutters 98 would block also the cathodes 91, 92; from each other, which prevents pre-sputtering by use of the shared film-deposition power source 94 connected to both of the cathodes 91, 92 from being carried out. In contrast, the arrangement shown in FIG. 1 and FIG. 2, where the two cathodes 20A, 20B are disposed on the same side (the side opposite to the substrate accommodation space 60) with respect to the movable shutter plates 51, 52 in the close portion, enables discharge for pre-sputtering of the cathodes 20A, 20B (discharge with the movable shutter plates 51, 52 closed) to be carried out by use of the film-deposition power source 40.

3) Film Deposition on the Substrate

Film deposition on the substrate surface by DMS can be initiated by moving the movable shutter plates 51, 52 from the close portion to the open position at the point in time of the complement of the pre-sputtering. Specifically, the gas ion atoms generated in the discharge knock off the film-deposition material from the surfaces of the targets 24 to cause the film-deposition material to adhere and deposit on the surface of the substrate, thus allowing the film deposition to advance. The criteria for establishing the end of the pre-sputtering can be selected as appropriate, for instance, from rises in the temperature of the targets 24, stabilization of the discharge state, or completion of removal of impurities through self-cleaning.

At the point in time of start of the film deposition, the discharge state has been already stabilized, and the target surfaces 24a have been cleaned through self-cleaning; this allows a high-quality thin film to be formed. After the film deposition has been thus finished, the substrate is cooled and taken out from the film deposition chamber 10.

Although only one pair of cathodes 20A, 20B is disposed in one film deposition chamber 10 in the film deposition device according to the first embodiment, the present invention permits cathode pairs each formed of the first and second cathodes 20A, 20B to be disposed at a plurality of position in the film deposition chamber 10 and to be connected with respective film-deposition power sources. Furthermore, it is also possible to provide another film deposition unit for executing film deposition different from sputtering performed by the first and second cathodes 20A, 20B in the same film deposition chamber 10.

Figure 4:
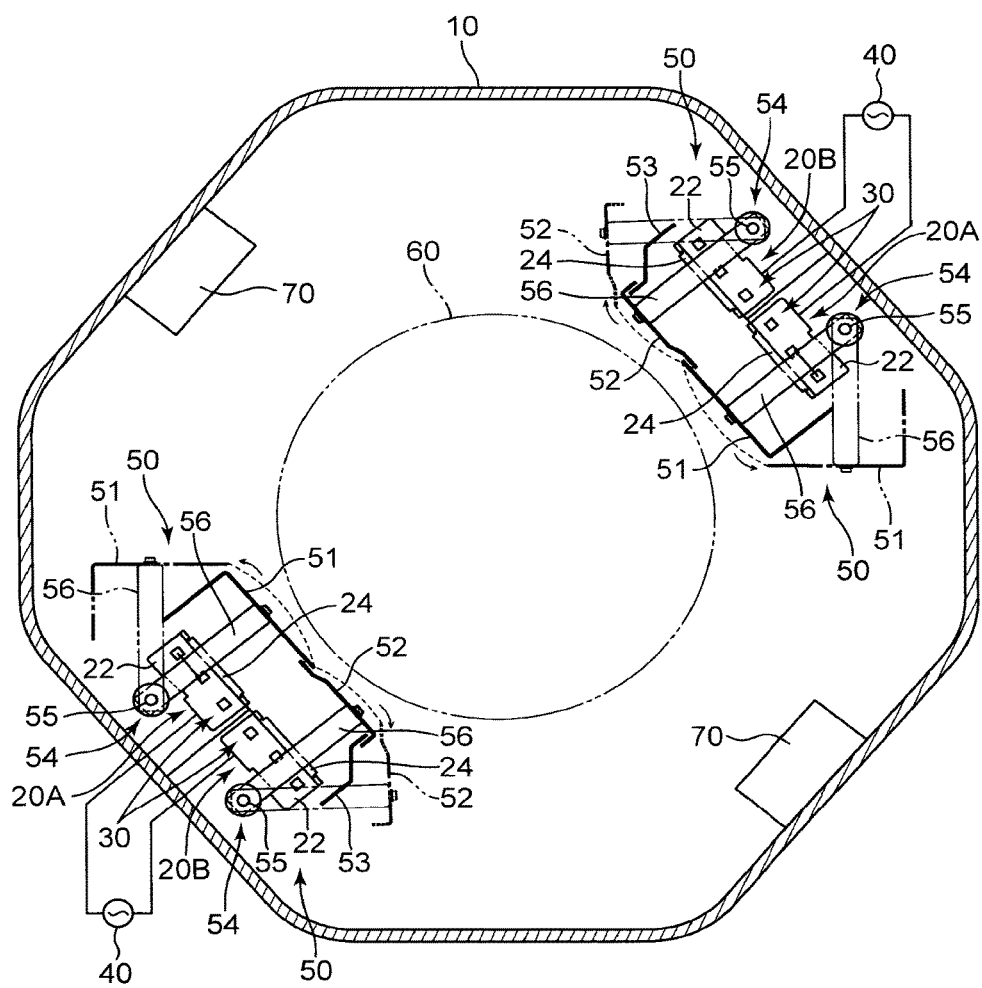
FIG. 4 is a cross-sectional plan-view diagram of a film deposition device according to a second embodiment of the present invention.

Shown in FIG. 4 is a film deposition device according to a second embodiment of the present invention, which allows the first and second cathodes 20A, 20B to be disposed at a plurality of positions similarly to the above-described disposition and further includes film deposition units 70 other than the first and second cathodes 20A, 20B, with a compact structure.

In this device, a set of the first and second cathodes 20A, 20B and shutter mechanisms 50 is disposed, in the film deposition chamber 10, at each of opposite positions which are opposite to each other across the substrate accommodation space 60. This arrangement allows the film deposition on the substrate accommodated in the substrate accommodation space 60 to be carried out efficiently and quickly through simultaneous driving of the target pairs disposed at the respective positions. In addition, closing the shutter in each shutter mechanism 50 allows pre-sputtering (self-cleaning) in the cathode pairs to be carried out without hindrance by the film-deposition power source 40 connected to the cathode pairs.

On the other hand, the other film deposition units 70 are provided at respective different positions different from the positions at which the first and second cathodes 20A, 20B are disposed, the different positions of the other film deposition units 70 surrounding the substrate accommodation space 60 together with the first and second cathodes 20A, 20B. Specifically, the film deposition units 70 are disposed at respective positions apart from the arrangement sites of respective cathodes 20A, 20B by 90° circumferentially of the film deposition chamber 10. This arrangement allows both of the film deposition by the film deposition units 70 and efficient dual magnetron sputtering through simultaneous driving of the first and second cathodes 20A, 20B disposed at opposite positions to be performed efficiently with a compact structure, in the single film deposition chamber 10.

For example, in the case where the film deposition units 70 is configured to perform film deposition by means other than sputtering (for instance, arc ion plating) and the deposited film is used as a main layer while the film formed by the first and second cathodes 20A, 20B is an upper layer overlaid on the main layer and constituting a functional layer imparted with an additional function, the film deposition by the film deposition units 70 has to be carried out in advance of the DMS by the first and second cathodes 20A, 20B and, therefore, film-deposition particles are generated during the film deposition. However, by keeping the movable shutter plates 51, 52 of the shutter mechanisms 50 at the close portion during execution of the film deposition by the film deposition units 70, the film deposition particles can be prevented from adhesion and deposition on the surfaces 24a of the targets 24, as a contaminant, in spite of the stop of the first and second cathodes 20A, 20B. Hence, following the film deposition by the film deposition units 70, a high-quality thin film can be formed on the base film having been formed by the film deposition units 70, through pre-sputtering and main film deposition by applying voltage to the first and second cathodes 20A, 20B in the same way as in the first embodiment.

As described above, according to the present invention, provided is a film deposition device including at least a pair of targets for dual magnetron sputtering and a film-deposition power source, the film deposition device being capable of pre-sputtering of the target by use of the film-deposition power source. The film deposition device includes: a film deposition chamber that accommodates a substrate at a specific position; a first cathode and a second cathode each having a target, the first cathode and the second cathode being disposed next to each other in such an attitude that respective surfaces of the targets face the substrate disposed at the specific position; a magnetic-field formation unit that forms a magnetic field for magnetron sputtering in the vicinity of the surfaces of the respective targets of the first and second cathodes; a film-deposition power source that is connected to the first and second cathodes to apply voltage to the first and second cathodes; and a shutter capable of making an opening-closing action between a close portion at which the shutter is interposed between the substrate and the surfaces of the respective targets of the first and second cathodes to block the surfaces of the respective targets of the first cathode and the second cathode, collectively, from the substrate and an open position at which the shutter opens the space between the substrate and the surfaces of the respective targets of the first and second cathodes to allow film deposition on a surface of the substrate to be performed by the targets.

In this film deposition device, the targets of the first and second cathodes are next to each other and the shutter is disposed so as to block the surfaces of the targets collectively from the substrate, in other words, since the targets of the first and second cathodes are disposed on the side opposite to the substrate across the shutter in a close portion, i.e., mutually on the same side; this allows the discharge between the first and second cathodes to be carried out by use of the film-deposition power source, in a state where the shutter is in the close portion. In short, the pre-sputtering can be carried out while the shutters are in their closing states.

Then, displacing the shutter to the open position following the complement of the pre-sputtering enables a film deposition on the substrate to be performed by dual magnetron sputtering by use of respective targets of the first and second cathodes.

The first and second cathodes are preferably disposed so as to orient the surfaces of the respective targets of the first and second cathodes in the same direction. This arrangement allows the shutter to make an opening-closing action with no interference with the substrate while being compactly disposed.

Specifically, it is preferable that the shutter includes a pair of opening-closing members juxtaposed in the same direction as a juxtaposition direction in which the respective targets of the first and second cathodes are juxtaposed, each of the opening-closing members being supported by the film deposition chamber so as to be able to make a rotational movement about a rotational axis perpendicular to the juxtaposition direction to move between the open position and the close portion through the rotational movement. Each of the opening-closing members can move between the close portion and the open position (i.e. can make an opening-closing movement) while making the rotational movement along a small trajectory enough to prevent the opening-closing member from interfere with the substrate.

In this case, it is preferable that the rotational axes are set, for example, at respective positions on the side opposite to the opening-closing members across the first and second cathodes. Thus setting the rotational axes makes the rotation radius of the opening-closing members be large to thereby allow the rotational trajectory of the opening-closing members to be prevented from bulging toward the substrate into interference with the substrate.

In the present invention, a set of the first cathode, the second cathode and the shutter is provided at each of opposite positions opposite to each other across the substrate, in the film deposition chamber. This arrangement allows the film deposition on the substrate to be carried out efficiently and quickly through simultaneous driving of the target pairs disposed at the respective positions. Furthermore, pre-sputtering (self-cleaning) in the target pairs can be carried out, through closing the shutter, by the film-deposition power source connected to the target pairs, without hindrance.

The film deposition device according to the present invention can further include, in addition to the first and second cathodes, a film deposition unit disposed in the film deposition chamber to execute film deposition different from sputtering performed by the first and second cathodes. In this case, keeping the shutter at the close portion during execution of other film deposition (for instance, arc ion plating or CVD) by the film deposition unit can prevent the film-deposition particles from adhesion and deposition, as a contaminant, on the surfaces of the targets of the first and second cathodes. Even if such adhesion occurs, the contaminant can be prevented from deposition on the target surfaces, by self-cleaning through discharge between the first and second cathodes in a closing state of the shutter.

Regarding this arrangement of the first and second cathodes and the film deposition unit, for instance, it is preferable that a set of the first cathode, the second cathode and the shutter is provided at each of opposite positions opposite to each other across the substrate, in the film deposition chamber, and that the film deposition unit is disposed at a different position different from the opposite positions, the different position surrounding the substrate together with the first and second cathodes. This arrangement allows both of the film deposition by the film deposition unit and the efficient dual magnetron sputtering through simultaneous driving of the first and second cathodes at the respective positions to be performed efficiently in the same film deposition chamber, with a compact structure.

The invention claimed is:

1. A film deposition device, comprising:
a film deposition chamber that accommodates a substrate at a specific position;
a first cathode and a second cathode each having a target, the first cathode and the second cathode being disposed next to each other in such an attitude that respective surfaces of the targets face the substrate disposed at the specific position;
one or more magnets that form a magnetic field for magnetron sputtering in the vicinity of the surfaces of the respective targets of the first and second cathodes;
a film-deposition power source that is connected to the first and second cathodes to apply voltage to the first and second cathodes; and
a shutter capable of making an opening-closing action between a closed position at which the shutter is interposed between the substrate and the surfaces of the respective targets of the first and second cathodes to block the surfaces of the respective targets of the first cathode and the second cathode; collectively, from the substrate and an open position at which the shutter opens the space between the substrate and the surfaces of the respective targets of the first and second cathodes to allow film deposition on a surface of the substrate to be performed by the targets, said shutter making said opening and closing action through a rotational movement about a rotational axis located behind one of the first and second targets.

2. The film deposition device according to claim 1, wherein the first and second cathodes are disposed so as to orient the surfaces of the respective targets of the first and second cathodes in the same direction.

3. The film deposition device according to claim 1, wherein the shutter includes a pair of opening-closing plates juxtaposed in the same direction as a juxtaposition direction in which the targets of the first and second cathodes are juxtaposed, each of the opening-closing plates being supported by the film deposition chamber so as to be able to make a rotational movement about a rotational axis perpendicular to the juxtaposition direction to move between the open position and the closed position through the rotational movement.

4. The film deposition device according to claim 3, wherein the rotational axes are set at respective positions on the side opposite to the opening-closing plates across the first and second cathodes.

5. The film deposition device according to claim 1, wherein a set of the first cathode, the second cathode and the shutter is provided at each of opposite positions opposite to each other across the substrate, in the film deposition chamber.

6. The film deposition device according to claim 1, further comprising, in addition to the first and second cathodes, a film deposition unit disposed in the film deposition chamber to execute film deposition different from sputtering performed by the first and second cathodes.

7. The film deposition device according to claim 6, wherein a set of the first cathode, the second cathode and the shutter is provided at each of opposite positions opposite to each other across the substrate, in the film deposition chamber, and wherein the film deposition unit is disposed at a different position different from the opposite positions, the different position surrounding the substrate together with the first and second cathodes.

8. The film deposition device according to claim 1, further comprising at least one pivot shaft located behind one of the first and second cathodes on a side of the first and second cathodes opposite to said specific position of the substrate, the shutter being connected to the at least one pivot shaft so as to make a rotational movement around the pivot shaft.

9. The film deposition device according to claim 8, wherein the respective surfaces of the targets face the substrate disposed at the specific position in respective facing directions and the at least one pivot shaft extends perpendicularly to each of the facing directions.

10. The film deposition device according to claim 8, wherein the film deposition chamber includes a top wall and a bottom wall, and wherein the at least one pivot shaft includes an upper pivot shaft held by the top wall and a lower pivot shaft held by the bottom wall.

11. The film deposition device according to claim 1, wherein the respective surfaces of the targets face the substrate disposed at the specific position in respective facing directions and the rotational axis of the shutter extends perpendicularly to each of the facing directions.

12. The film deposition device according to claim 11, wherein each of the facing direction is horizontal and the rotational axis of the shutter extends vertically.

13. The film deposition device according to claim 1, further comprising a pair of opening-closing support mechanisms disposed in the film deposition chamber to support for the shutter a pair of opening-closing plates, respectively, so as to allow each of the opening-closing plates to make the rotational movement.

14. The film deposition device according to claim 13, wherein each of the opening-closing support mechanisms includes a pivot shaft located behind one of the first and second cathodes on a side of the first and second cathodes opposite to said specific position of the substrate and a rotative arm linking the pivot shaft and the opening-closing plate so as to allow one of the opening-closing plates to make the rotational movement around the pivot shaft.

15. The film deposition device according to claim 14, wherein the respective surfaces of the targets face the substrate disposed at the specific position in respective facing directions and the rotational axis of the shutter extends perpendicularly to each of the facing directions.

16. The film deposition device according to claim 15, wherein each of the facing directions is horizontal and the pivot shaft extends vertically.

* * * * *